(12) United States Patent
Plager et al.

(10) Patent No.: US 8,547,188 B2
(45) Date of Patent: Oct. 1, 2013

(54) FILTER WITH INTEGRATED LOADING CAPACITORS

(75) Inventors: Steve Plager, Phoenix, AZ (US); Lothar Johannes Musiol, Tempe, AZ (US)

(73) Assignee: TDK Corporation, Tokyo (JP)

( * ) Notice: Subject to any disclaimer, the term of this patent is extended or adjusted under 35 U.S.C. 154(b) by 1045 days.

(21) Appl. No.: 12/391,021

(22) Filed: Feb. 23, 2009

(65) Prior Publication Data

US 2010/0214037 A1    Aug. 26, 2010

(51) Int. Cl.
*H03H 7/01* (2006.01)
*H01P 1/203* (2006.01)

(52) U.S. Cl.
USPC .......................................... 333/185; 333/204

(58) Field of Classification Search
USPC ................... 333/203, 204, 219, 185
See application file for complete search history.

(56) References Cited

U.S. PATENT DOCUMENTS

| | | | | |
|---|---|---|---|---|
| 6,020,799 | A * | 2/2000 | Ishizaki et al. | 333/204 |
| 6,140,891 | A * | 10/2000 | Nakakubo et al. | 333/204 |
| 7,231,238 | B2 * | 6/2007 | Cortes et al. | 505/210 |
| 7,312,676 | B2 * | 12/2007 | Kundu | 333/204 |
| 7,907,034 | B2 * | 3/2011 | Taniguchi | 333/185 |
| 2003/0085780 | A1 * | 5/2003 | Wang | 333/204 |
| 2010/0164651 | A1 * | 7/2010 | Erb | 333/204 |

* cited by examiner

*Primary Examiner* — Dean O Takaoka
*Assistant Examiner* — Alan Wong
(74) *Attorney, Agent, or Firm* — Allen J. Moss; Squire Sanders (US) LLP

(57) ABSTRACT

There is provided an improved filter having resonators substantially disposed between conductive planes which form one or more loading capacitors that are in turn coupled to the resonators. Further, inclusion of a designed void or slot in one or more of the conductive planes allows for control of an introduced transmission zero to manipulate the performance of the filter to achieve desired results, such as improved skirt performance.

25 Claims, 23 Drawing Sheets

FILTER WITH INTEGRATED LOADING CAPACITORS

DESCRIPTION OF THE INVENTION

1. Field of the Invention

The present invention relates to electronic bandpass filters, and more specifically to high-frequency thin-film multilayer bandpass filters.

2. Background of the Invention

As the development of high performance electronic circuits continues to evolve, market forces have continued to demand ever higher performance and reliability standards with the somewhat paradoxical goals of smaller device sizes and lower costs. Particularly, many communication devices incorporate high-performance complex components such as stripline filter assemblies, and with consumer devices shrinking to ever smaller form factors, size of electronic components is a substantial design concern.

Traditionally, filters such those implemented in multilayer embodiments such as low-temperature cofired ceramic (LTCC) substrates may incorporate stripline resonators that are usually built with unobstructed dielectric space between the top and bottom ground planes, because it has been a design requirement that the propagation of the transverse electromagnetic (TEM) wave in a stripline resonator requires a homogenous medium. As a result, loading capacitors that are coupled to the resonators have been placed outside the section of the substrate that incorporates the resonators and therefore one of the filter dimensions is necessarily larger than the length of the resonators. Further, to achieve the necessary value of loading capacitance in a judicious use of substrate space, a sandwich geometry is commonly used and the capacitor ground plates are connected to the ground plane with vias. These ground vias have both a beneficial and one detrimental effect: the ground vias produce a desirable transmission zero at the high side of the filter skirt, but the vias also produce undesirable flyback at higher frequencies. The frequency of this transmission zero is difficult to control or predict.

What is needed is an apparatus and design method that reduces overall space required by a multilayered substrate to implement a filter such as a bandpass stripline resonator filter. What is further needed is a structure that allows introduction of a desired transmission zero to improve skirt performance of the bandpass filter.

SUMMARY OF THE INVENTION

In view of the foregoing, there is provided an improved filter having resonators substantially disposed between conductive planes which form one or more loading capacitors that are in turn coupled to the resonators. Further, inclusion of a designed void or slot in one or more of the conductive planes allows for control of an introduced transmission zero to manipulate the performance of the filter to achieve desired results, such as improved skirt performance.

Some filter structures exhibit desirable characteristics that are dominated by parasitic effects. These effects are difficult to control as they are generated by features not usually considered tunable elements. One such characteristic is a transmission zero on the high side of a filter pass band that is produced by the inductance of ground vias.

Such ground vias may be utilized, for instance, to couple loading capacitors that have been implemented with a sandwich structure to filter resonators. However, as was mentioned above, the placement of loading capacitors outside of the substrate volume occupied by the resonators necessarily increases the overall size of the filter substrate. Therefore, an embodiment of the present invention places loading capacitors directly below and/or above filter resonators, therefore reducing the overall size of the filter substrate since loading capacitors are now stacked above and/or below the resonators. When this approach is taken, the former ground vias required to couple to the external sandwich loading capacitors are no longer needed, which eliminates a desired transmission zero induced by the parasitics of the ground via.

Embodiments of the present invention incorporate structures to control this parasitic effect by the introduction of a slot or void in the filter ground plane. The slot or void has a dimension that can be adjusted to tune the transmission zero frequency. Consideration is given to the proximity of other ground planes that can also affect the location of the transmission zero.

Since embodiments of the present invention do not require a sandwich capacitor with its associated ground vias, undesired flyback is avoided. In various embodiments, in addition to reducing filter size, a desired transmission zero is reintroduced and with control over the geometry of a void or slot in a metallic structure, parametric control of the transmission zero frequency may be accomplished. In one embodiment, the transmission zero frequency can be controlled by varying only a single physical dimension of the void or slot. In another implementation, to further reduce the filter size, the stripline resonator geometry is implemented in a meander or snake-like geometry.

An embodiment of the present invention comprises a filter disposed within a multilayer substrate, having a first and second resonator, the first and second resonators respectively having a short circuit end and an open circuit end, the respective short circuit ends of the first and second resonators coupled to a first ground plane; an input coupled to the first resonator; an output coupled to the second resonator; a first loading capacitor coupled to the open circuit end of the first resonator, the first loading capacitor comprising a first capacitor plate and a second capacitor plate; a second loading capacitor coupled to the open circuit end of the second resonator, the second loading capacitor comprises a first capacitor plate and a second capacitor plate; and wherein the first and second resonators are disposed in a resonator plane substantially parallel to and vertically displaced from at least one of the respective first capacitor plate and the second capacitor plate of the respective first and second loading capacitors, wherein at least one of the first and second resonators is at least partially overlapped by at least one of: the first capacitor plate or the second capacitor plate of the first loading capacitor, or the first capacitor plate or the second capacitor plate of the second loading capacitor.

In one aspect of the invention, the second capacitor plate of the first loading capacitor and the second capacitor plate of the second loading capacitor are substantially coplanar and are coupled to the first ground plane. The first ground plane may include at least one void area wherein the void area forms a substantially isolated region of the first ground plane, and in one implementation the at least one void area comprises a slot of a predetermined width at least partially circumscribing a portion of the first ground plane proximal to the second capacitor plates of the first and second loading capacitors. The at least one void area may also include a plurality of slots of respective predetermined widths creating a respective plurality of at least partially isolated regions comprising the second capacitor plates of the first and second loading capacitors.

The void area may comprise any appropriate area or configuration, such as a slot of a predetermined width at least partially circumscribing a nearly complete rectangular area of the first ground plane. The nearly complete rectangular area may in some cases be equal to or larger than the projected area of the first capacitor plate of the first loading capacitor and the first capacitor plate of the second loading capacitor. The filter of the present invention may also include an inductor coupled between at least one of the second capacitor plates of the first and second loading capacitors and the first ground plane. The value of the inductor is controlled by a predetermined dimension of a conductive coupling region disposed between at least two edges of the at least one void area of the first ground plane.

Additional aspects of the invention may include additional coupling capacitors such as a capacitor coupled to the first resonator, and a fourth loading capacitor coupled to the second resonator, the third and fourth loading capacitors respectively comprising a first capacitor plate and a second capacitor plate wherein at least one of the first capacitor plates of the third and fourth loading capacitors overlap at least one of the first and second resonators. The second capacitor plate of the third loading capacitor and the second capacitor plate of the fourth loading capacitor may be substantially coplanar in the substrate and may be coupled to a second ground plane.

In another aspect, the second ground plane includes at least one void area wherein the void area forms a substantially isolated region of the second ground plane. The at least one void area may also comprise a slot of a predetermined width at least partially circumscribing a portion of the second ground plane proximal to the second capacitor plates of the third and fourth loading capacitors. A variety of slot configurations may be utilized, for instance at least one void area comprises a plurality of slots of predetermined widths creating a respective plurality of at least partially isolated regions comprising the second capacitor plates of the third and fourth loading capacitors.

Embodiments of the present invention may also include an inductor coupled between at least one of the second capacitor plates of the third and fourth loading capacitors and the second ground plane. The value of the inductor may be controlled in any appropriate manner such as designing the topology of the multilayer substrate to include a predetermined dimension of a conductive coupling region disposed between at least two edges of the at least one void area of the second ground plane.

Various alternate embodiments of the present invention include an implementation where the first and second resonators comprise a substantially serpentine meander shape. The substrate of the present invention may be of any appropriate type or configuration, and may include at least one of a low temperature co-fired ceramic substrate, a high temperature co-fired ceramic substrate, a silicon substrate, a gallium arsenide substrate, a thin film substrate, and an organic circuit substrate.

Another embodiment of the present invention includes a filter disposed within a multilayer substrate, the filter comprising: first and second resonators, the first and second resonators respectively having a short circuit end and an open circuit end, the respective short circuit ends of the first and second resonators coupled to a first ground plane; an input coupled to the first resonator; an output coupled to the second resonator; at least one loading capacitor coupled to the open circuit end of at least one of the first and second resonators, wherein: the at least one loading capacitor includes a two or more parallel conductive elements including one or more conducting plates and one or more ground plates; the one or more ground plates includes at least one void area in proximity to the conducting plate; and the first and second resonators are substantially disposed in a resonator plane parallel to and vertically displaced from at least one of the conducting plate and the ground plate, wherein at least one of the conducting plate and the ground plate overlap at least one of the first and second resonators.

In an embodiment, one or more ground plates are substantially coplanar and are coupled to the first ground plane. Another aspect is provided where the void area forms a substantially isolated region of the first ground plane and further includes the one or more ground plates of the at least one loading capacitor. Further, the at least one void area may comprise a slot of a predetermined width at least partially circumscribing a portion of the first ground plane proximal to the one or more ground plates of the at least one loading capacitor. Alternatively, the at least one void area may comprise a plurality of slots of a predetermined widths creating a respective plurality of at least partially isolated regions comprising the one or more ground plates of the at least one loading capacitors. The at least one void area may also comprise a slot of a predetermined width at least partially circumscribing a nearly complete rectangular area of the first ground plane. In some instances, the nearly complete rectangular area may be equal to or larger than the projected area of the one or more conducting plates of the at least one loading capacitor.

Differential embodiments of the present invention are also provided. An embodiment of a differential filter disposed within a multilayer substrate, includes first and second resonators, the first and second resonators coplanar and respectively having a short circuit end and an open circuit end, the respective short circuit ends of the first and second resonators coupled to a first ground plane; a first input coupled to the first resonator; a first output coupled to the second resonator; third and fourth resonators, the third and fourth resonators coplanar and respectively having a short circuit end and an open circuit end, the respective short circuit ends of the third and fourth resonators coupled to the first ground plane wherein the first and second resonators are respectively disposed in vertically offset substantially parallel proximity to the third and fourth resonators; a second input coupled to the third resonator; a second output coupled to the fourth resonator; and four loading capacitors respectively coupled to the open circuit ends of the four resonators, wherein: the loading capacitors respectively comprise two or more parallel conductive elements including one or more conducting plates and a one or more ground plates, wherein at least one of the conducting plates and the ground plates overlap at least one of the first, second, third, and fourth resonators.

In the differential embodiment, the one or more ground plates may be substantially coplanar and are coupled to the first ground plane. Further, the void area may form a substantially isolated region of the first ground plane and further includes the one or more ground plates of the four loading capacitors. The at least one void area may also comprise a slot of a predetermined width at least partially circumscribing a portion of the first ground plane proximal to the ground plates of the four loading capacitors. In another aspect, the at least one void area comprises a plurality of slots of a predetermined widths creating a respective plurality of at least partially isolated regions comprising the one or more ground plates of the at least one loading capacitors. Also, the at least one void area may comprise a slot of a predetermined width at least partially circumscribing a nearly complete rectangular area of the first ground plane, and the nearly complete rectangular area may be equal to or larger than the projected area of the one or more conducting plates of the four loading capacitors.

The differential filter may further include an inductor coupled between the one or more ground plates of the four loading capacitors and the first ground plane. The value of the inductor may be controlled by a predetermined dimension of a conductive coupling region disposed between at least two edges of the at least one void area of the first ground plane.

It is to be understood that the descriptions of this invention herein are exemplary and explanatory only and are not restrictive of the invention as claimed.

DESCRIPTION OF THE EMBODIMENTS

Reference will now be made in detail to the present exemplary embodiments of the invention, examples of which are illustrated in the accompanying drawings.

Figure 1:
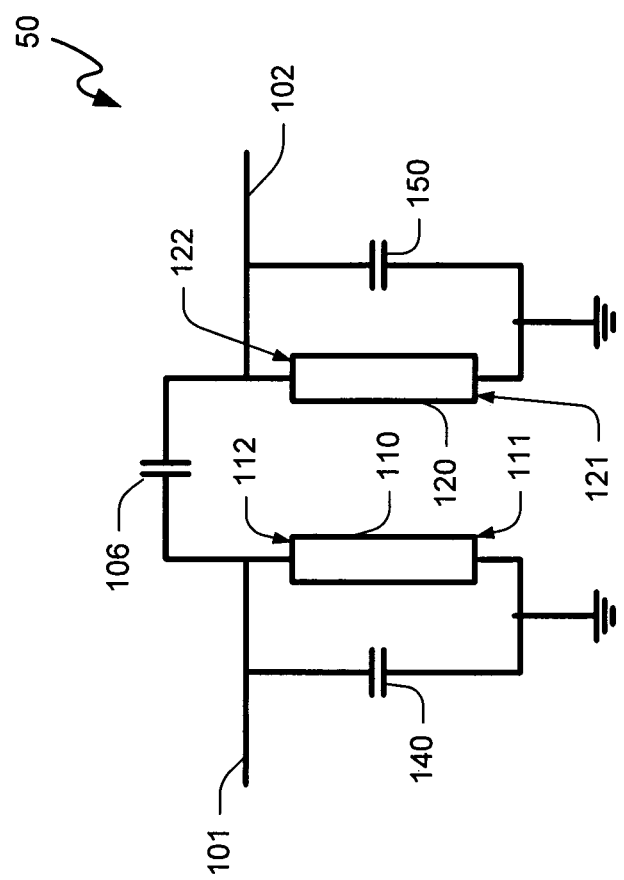
FIG. 1 illustrates a two-resonator circuit schematic for a filter embodiment of the present invention.
Figure 2:
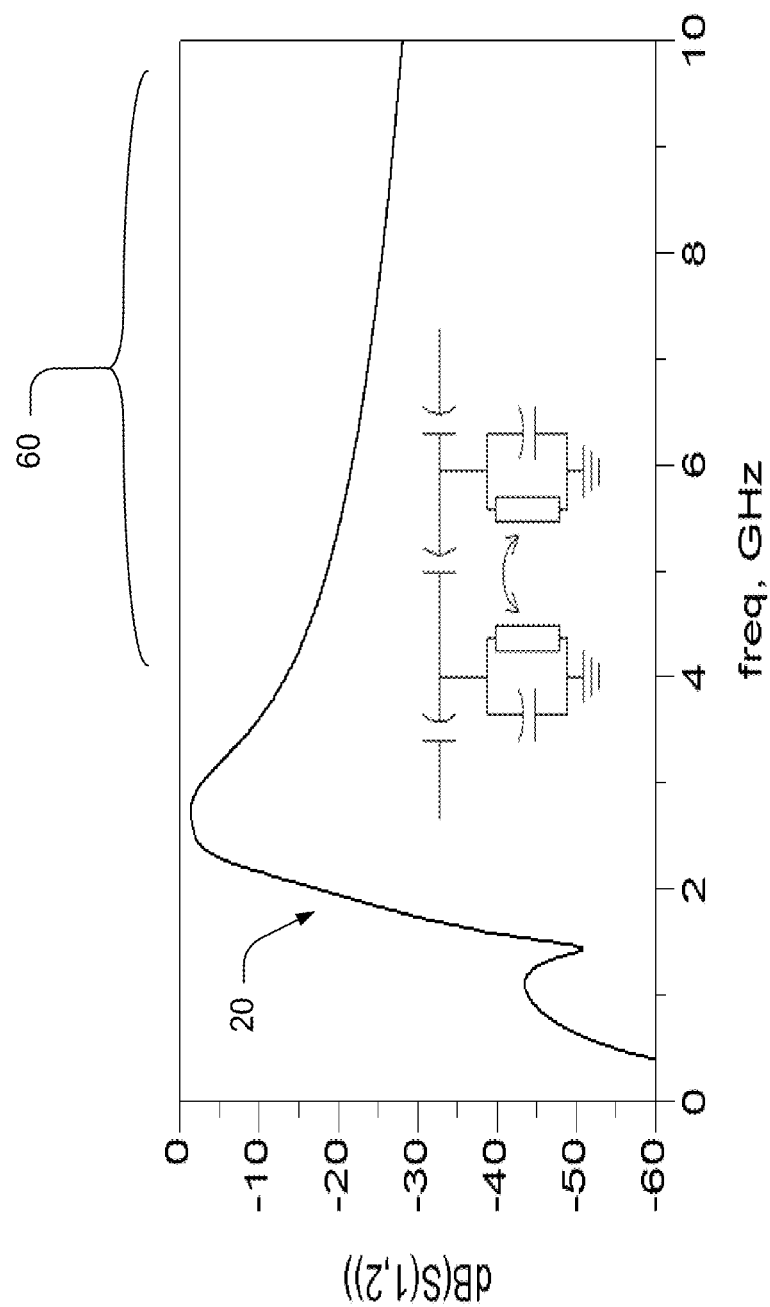
FIG. 2 illustrates a frequency response diagram of the circuit shown in FIG. 1.

FIG. 1 shows a schematic a filter configuration schematic 50 with two resonators 110, 120, with an input 101 coupled to the open circuit end 112 of resonator 110, and an output 102 coupled to the open circuit end 122 of resonator 120. Those of skill in the art recognize that more than two resonators may be used, and embodiments are disclosed below with three or more resonators. Each of the two resonators 110, 120, is in turn respectively coupled to ground at their short circuit ends 111, 121. In one embodiment, the resonators 110, 120, may comprise any appropriate resonator structures such as transverse electromagnetic quarter-wave resonators. FIG. 2 shows a simplified view of the circuit along with its typical response. The illustrated filter does not apparently exhibit a transmission zero on the right side of the pass band. However, when this type of filter is implemented in a multilayer substrate a transmission zero often will appear somewhere on the right side but the location of the transmission zero may be difficult to control by the designer. This is because the transmission zero is often due to the effect of ground vias which are not usually considered tunable elements.

Figure 3:
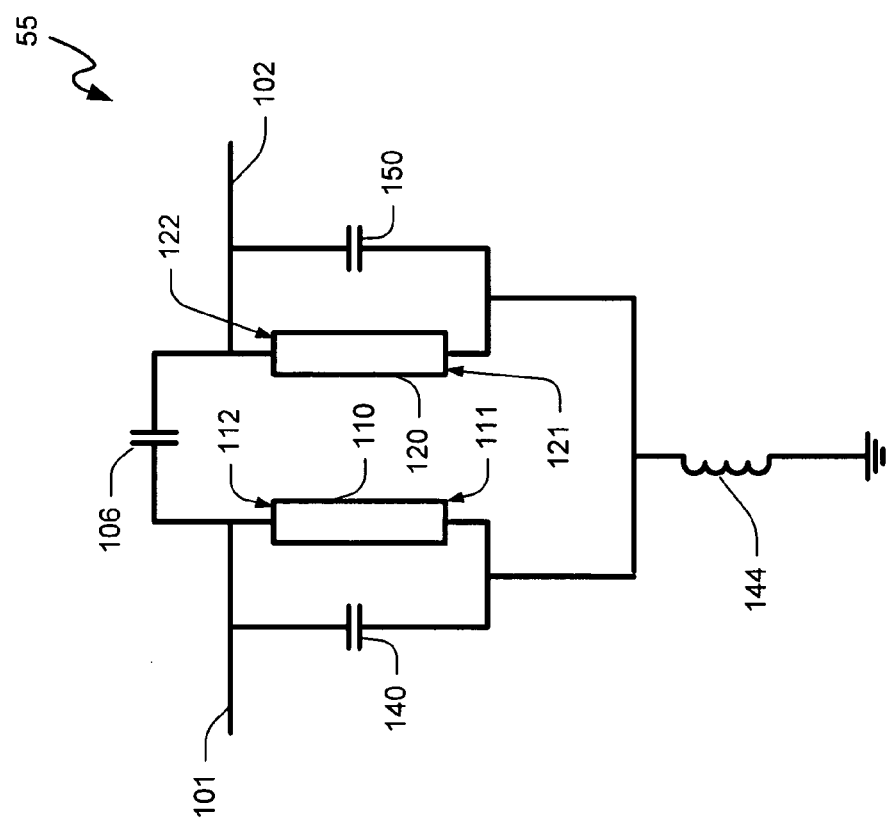
FIG. 3 illustrates a circuit schematic for a filter embodiment of the present invention with an additional inductor.
Figure 4:
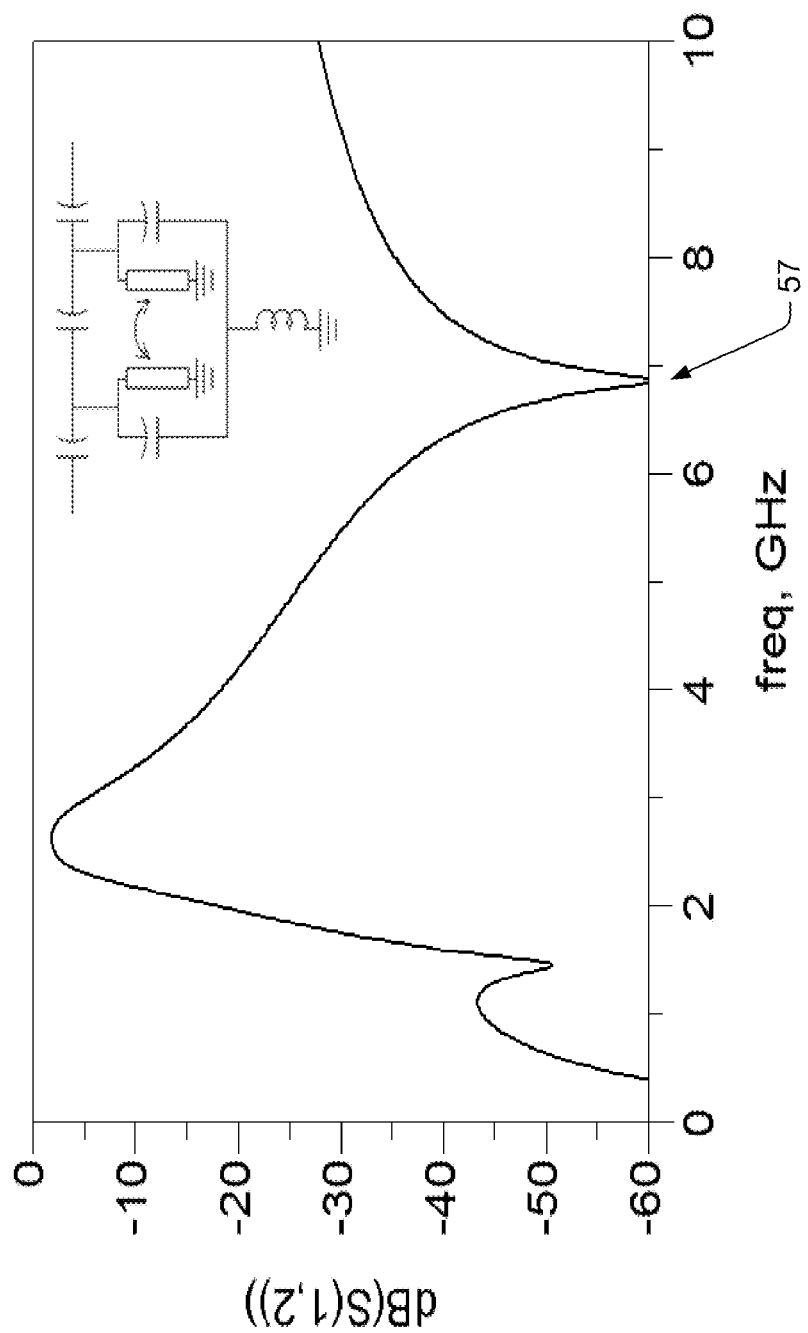
FIGS. 4 and 5 illustrate frequency response diagrams of the circuit shown in FIG. 3 with varying values of inductance.
Figure 5:
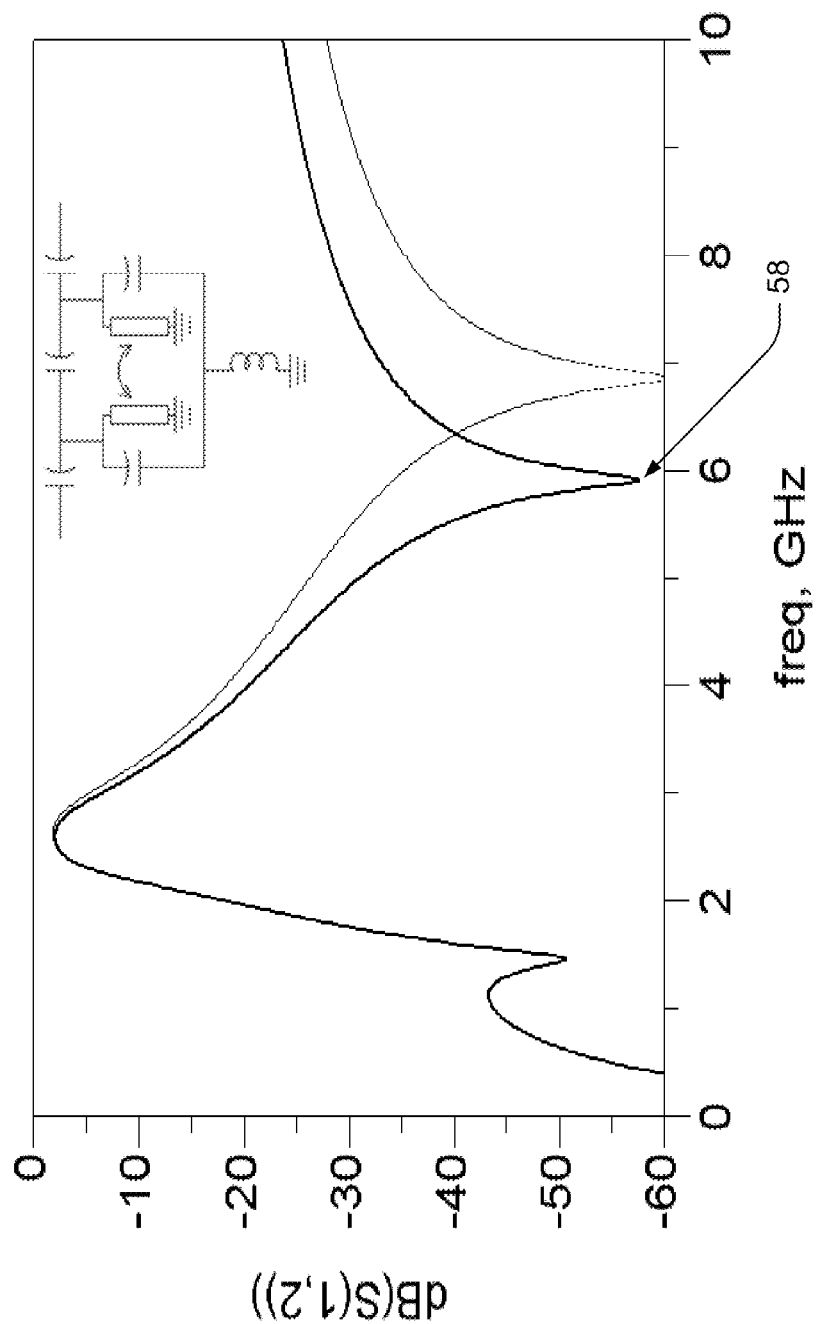

FIG. 3 illustrates a similar filter circuit 55 but with an inductor 144 added between the short circuit ends 111, 112 of the resonators 110, 120 and a ground such as a ground plane. Using an exemplary value for the inductor 144 of just 30 pH, the response of this circuit is illustrated in FIG. 4, showing a transmission zero 57 at approximately 7 GHz. Increasing the exemplary value of the inductor 144 produces shifts the transmission zero location shifted by approximately 1 GHz to about 6 GHz (FIG. 5, 58).

Figure 6:
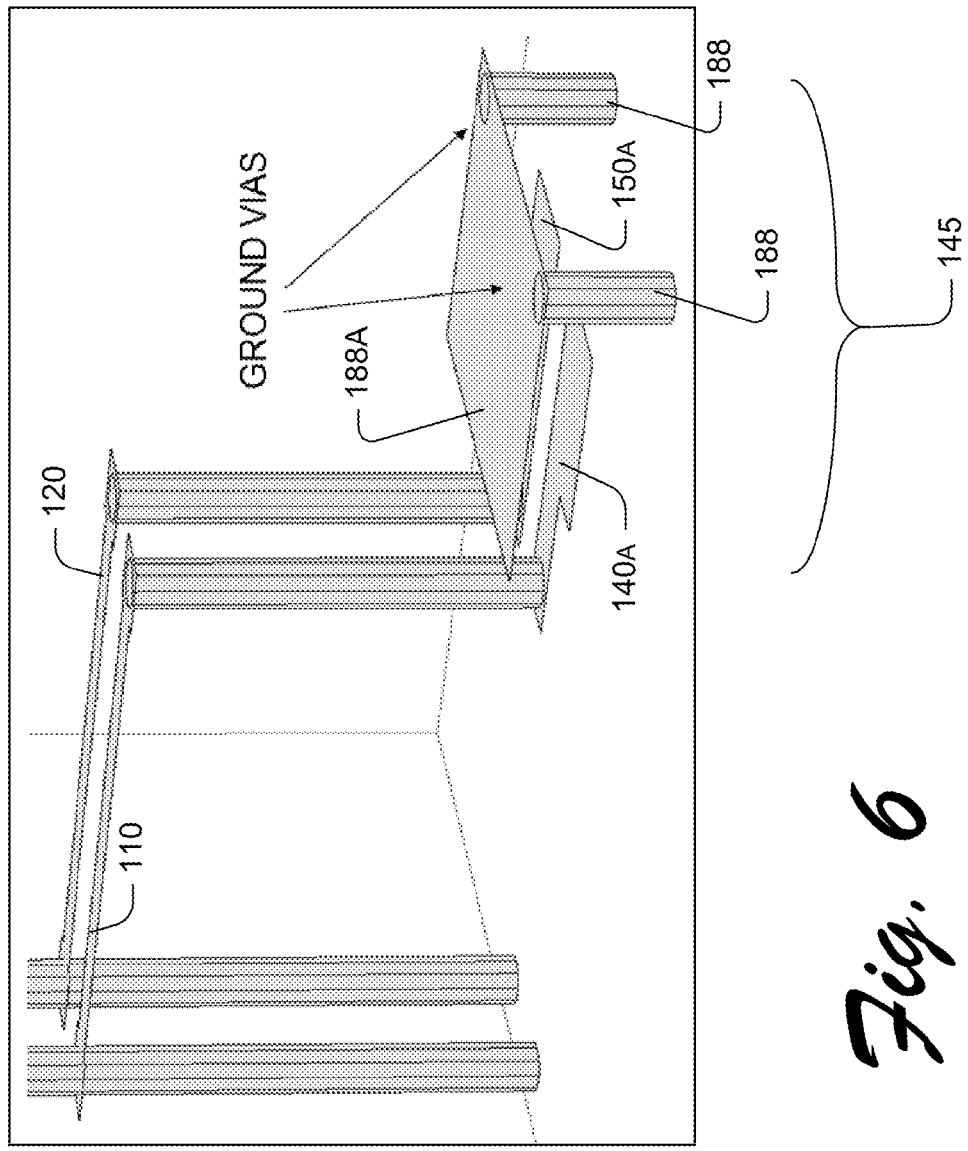
FIG. 6 shows a perspective view of a prior art multilayer filter.

Referring to FIG. 6, a prior art implantation of a stripline resonator filter is shown with resonators 110, 120, respectively coupled to sandwich loading capacitors created by conductive capacitor plates 140A, 140B, in proximity to a second capacitor plate 188A, which in the illustrated case is a ground plane formed by coupling conductive plate 188A to ground through ground vias 188. One of skill in the art may appreciate that the external sandwich capacitor stack 145 consumes a significant amount of footprint area of the surrounding substrate in addition to the footprint area taken by the resonator assembly.

Figure 7:
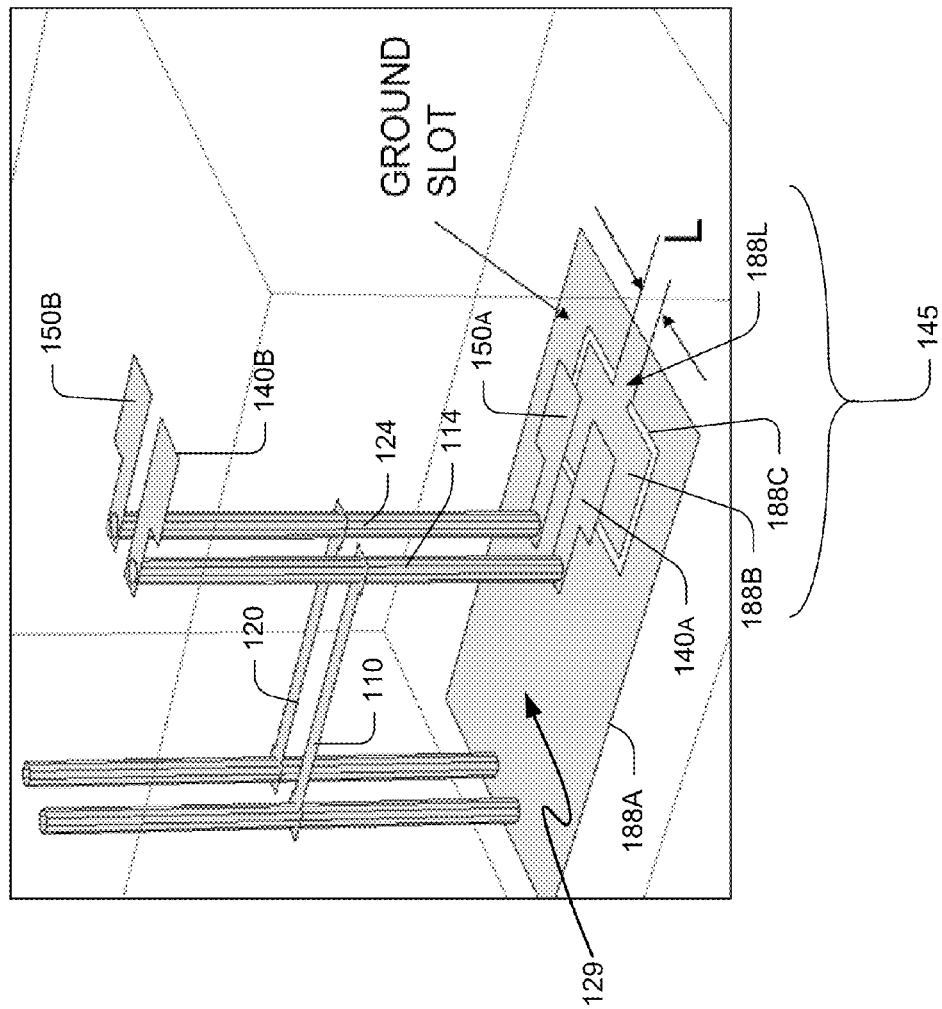
FIG. 7 illustrates perspective view of an exemplary implementation of a slotted isolation region embodiment of the present invention.

FIG. 7 shows an embodiment of the present invention that includes a controllable inductive element coupled to the loading capacitors. The capacitor stack 145 is shown outside the footprint area 129 of the resonators 110, 120, but is now implemented by respectively coupling the resonators 110, 120 to the conductive capacitor plates 140A, 150A through vias 114, 124. Vias 114, 124 are not coupled to the ground plane 188A. Loading capacitors are realized by the electrical field formed between the respective capacitor plates 140A, 150A and the at least partially circumscribed area of the ground plane 188B. The ground slot 188C forms a void in the ground plane 188A, partially isolating a conductive region of the ground plane 188B, and by varying the dimensions of the void, in this instance the dimension L of the slot 188C, the amount of inductance coupling the loading capacitors to ground can be selected, and may be further confirmed by such techniques as tuning parameters in an EM simulation. In the illustrated embodiment, the slot 188C in the ground plane is not continuous, but has a "connecting bar" region 188L shown between reference lines with dimension L. By changing the dimension L, the transmission zero frequency may be tuned as desired.

Also shown in FIG. 7, top capacitor plates 140B, 150B are respectively coupled to the resonators 110, 120 through the vias 114, 124. These plates in proximity to a top ground plane located above the illustrated assemblies (not shown for clarity) would further increase the amount of the loading capacitance by acting as additional capacitance respectively coupled in parallel. Further, a slot or void may similarly be placed in the top ground plane to create a parametrically controllable transmission zero. The additional capacitance created by the top capacitor plates 140B, 150B and the top ground plane (not shown) assists in decreasing the footprint required to implement by the capacitor stack 145.

Another embodiment further improves on the filter design by making the filter structure much more compact. This is accomplished, in part, by "nesting" the resonators at least partially within the same substrate footprint area occupied by the capacitor stack. Put another way, the loading capacitors in various embodiments may be placed within the resonator space, where at least part of one of the loading capacitors "overlaps" one or more of the resonators. Overlap between a loading capacitor and a resonator can occur, for example, if a line can be drawn that is orthogonal to the plane containing the resonator and if the line can be extended to intersect both the resonator and at least one of the capacitor plates. In various embodiments, the filter can be made even more compact by "meandering" the resonators in a serpentine or snake-like configuration.

Figure 8:
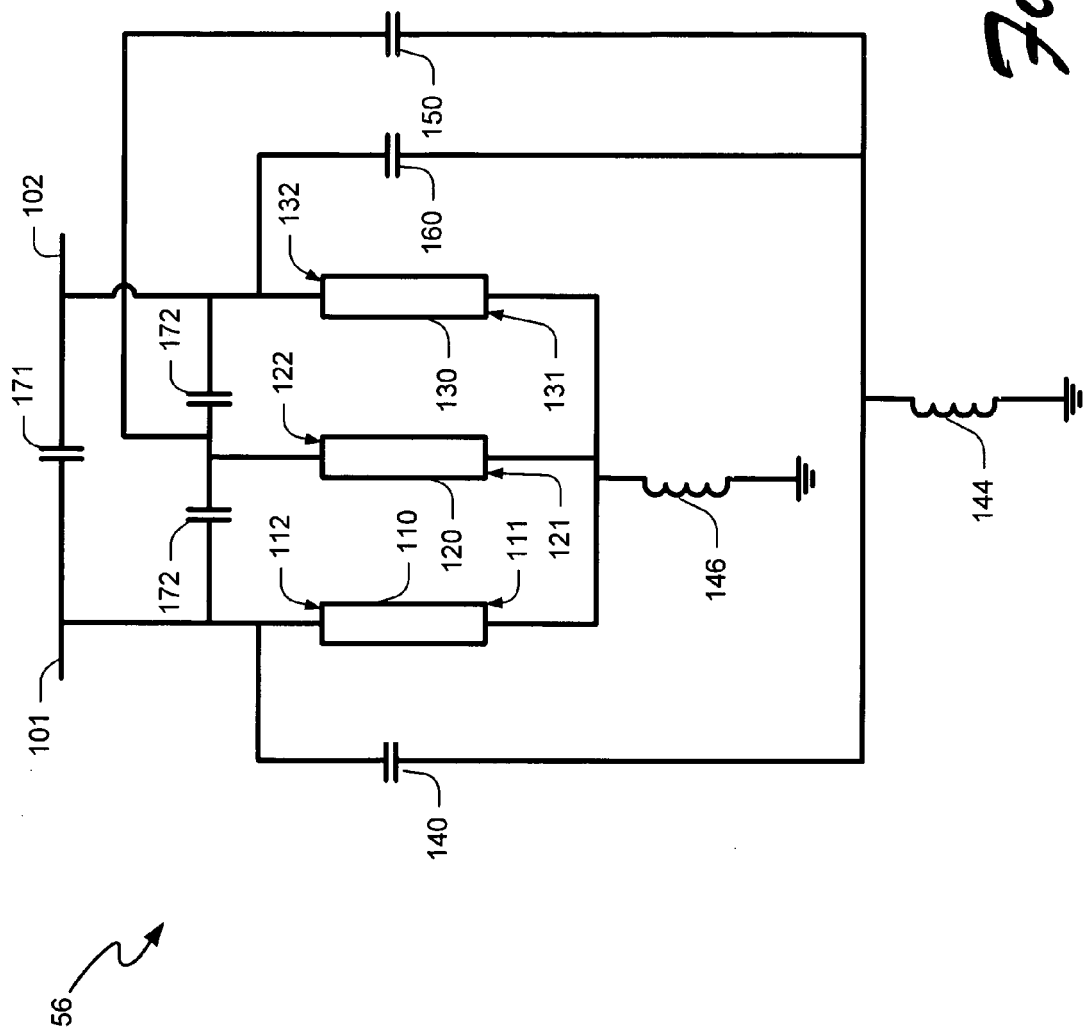
FIG. 8 illustrates a three-resonator filter circuit schematic for an embodiment of the present invention.

FIG. 8 illustrates a three-resonator filter circuit schematic 56 for an embodiment of the present invention. Three resonators 110, 120, 130 are shown in the present embodiment with an input 101 coupled to the open circuit end 112 of resonator 110, and an output 102 coupled to the open circuit end 132 of resonator 130. Those of skill in the art recognize that more than three resonators may be used to achieve any desired filter performance criterion. Each of the three resonators 110, 120, 130 is coupled to an inductor 146 at the respective short circuit end 111, 121, 131. The inductor 146 represents an amount of inductance attributable to a via coupling the resonators 110, 120, 130 to ground. In one embodiment, the resonators 110, 120, 130 may comprise any appropriate resonator structures such as transverse electromagnetic quarter-wave resonators.

FIG. 8 also illustrates loading capacitors 140, 150, 160 respectively coupling the respective open circuit ends 112, 122, 132 of the resonators 110, 120, 130 to an inductor 144 that is in turn coupled to ground. The inductor 144 represents an amount of predetermined inductance provided by embodiments of the present invention by such mechanisms as a connection region created proximate to a void area in a ground plane (further discussed below such as in association with FIGS. 8A and 9). In an embodiment, coupling capacitors 172 are also provided to couple the respective open circuit ends 112, 132 of the resonators 110, 130 to the open circuit end 122 of resonator 120. A feedback capacitor 171 may also be provided, and is coupled between the respective open circuit ends 112, 132 of the resonators 110, 130.

Figure 8A:
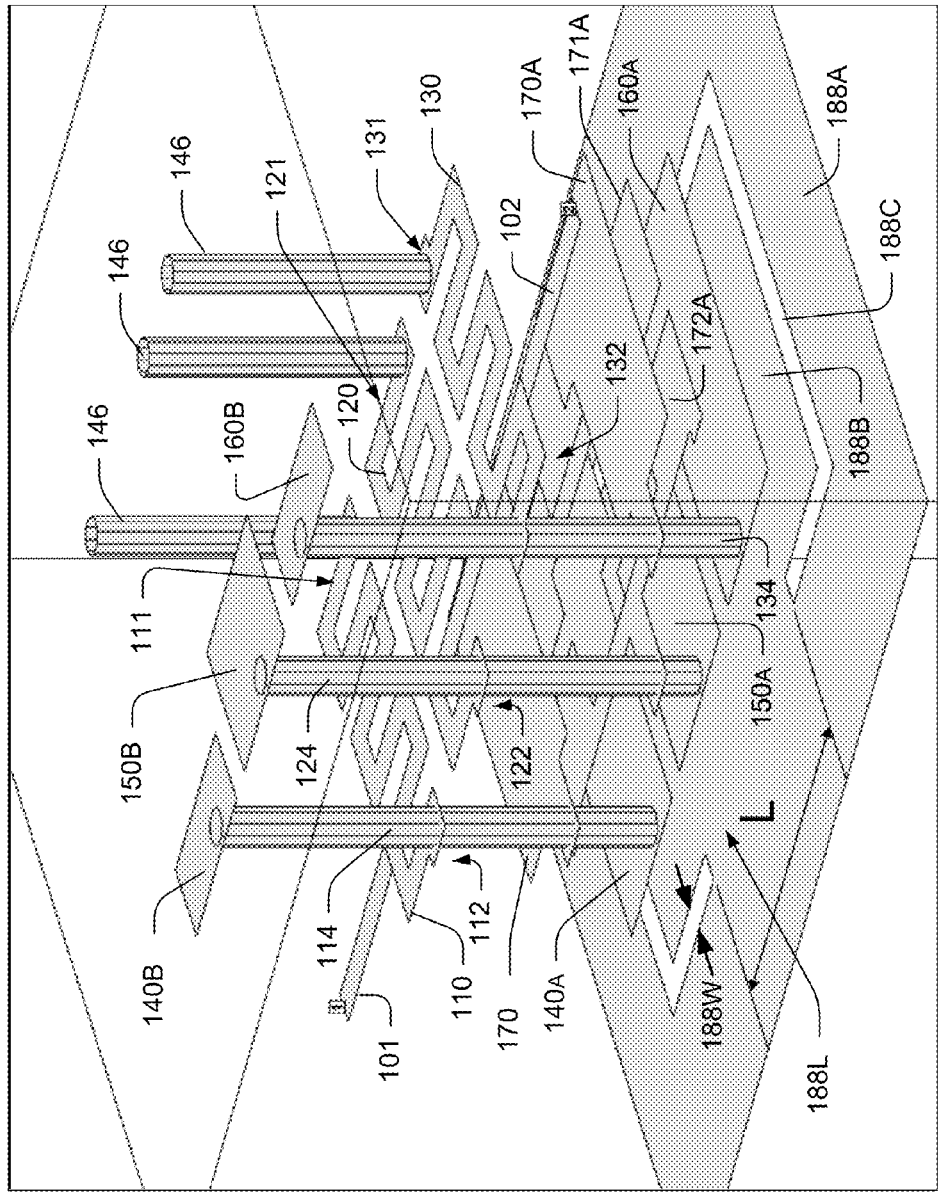
FIG. 8A illustrates a perspective view of a multilayer substrate implementation of the present invention utilizing three serpentine resonators and nested coupling capacitors.

FIG. 8A illustrates a multilayer thin film implementation 100 of the filter circuit 56 shown in FIG. 8, where the filter has three meandered resonators 110, 120, 130 nested with overlapping loading capacitors. Serpentine resonators 110, 120, 130 are respectively coupled to bottom capacitor plates 140A, 150A, 160A through vias 114, 124, 134. The resonators 110, 120, 130 are also respectively coupled to top capacitor plates 140B, 150B, 160B through vias 114, 124, 134. The resonators 110, 120, 130 are also respectively coupled to ground at their respective short circuit ends 111, 121, 131 through resonator ground vias 146. An input 101 is coupled to the open circuit end 112 of resonator 110, and an output 102 is coupled to the open circuit end 132 of resonator 130. Loading capacitors (FIG. 8, 140, 150, 160) are formed by the capacitor plates 140A, 150A, 160A, in proximity to the partially isolated ground plane 188B, which provides the "second" capacitor plate for each of the respective loading capacitors 140A, 150A, 160A. Those of skill in the art appreciate that the partially isolated area 188B may comprise a plurality of partially isolated areas, and may include multiple isolated conductive regions respectively in proximity to the respective conductive plates 140A, 150A, 160A (see, for example, but not by way of limitation, FIGS. 13, 14, 16, 17, 20). Similarly, the top conductive capacitor plates 40B, 150B, 160B further increase the respective loading capacitance coupled to the resonators 110, 120, 130 by an electric field formed between themselves and a top ground plane (not shown). The top ground plane may have no voids or slots or may also include voids or slots to create inductive impedance and thereby further allow customization of circuit parameters, and may be desired especially if a differential filter embodiment is utilized (discussed in more detail below).

The design of the slot 188C may be undertaken in any desired manner. In one embodiment, the width 188W of the slot 188C is as narrow as allowed by the design rules of the particular substrate type; for example, in one implementation, approximately 100 μm may be selected for the slot width. The positioning of the connecting metal region 188L also may be chosen for particular results; for example, the connecting region 188L may be preferably disposed in proximity to the respective open circuit ends 112, 122, 132 of the resonators 110, 120, 130 rather than at the respective short circuit ends 111, 121, 131.

Figure 9:
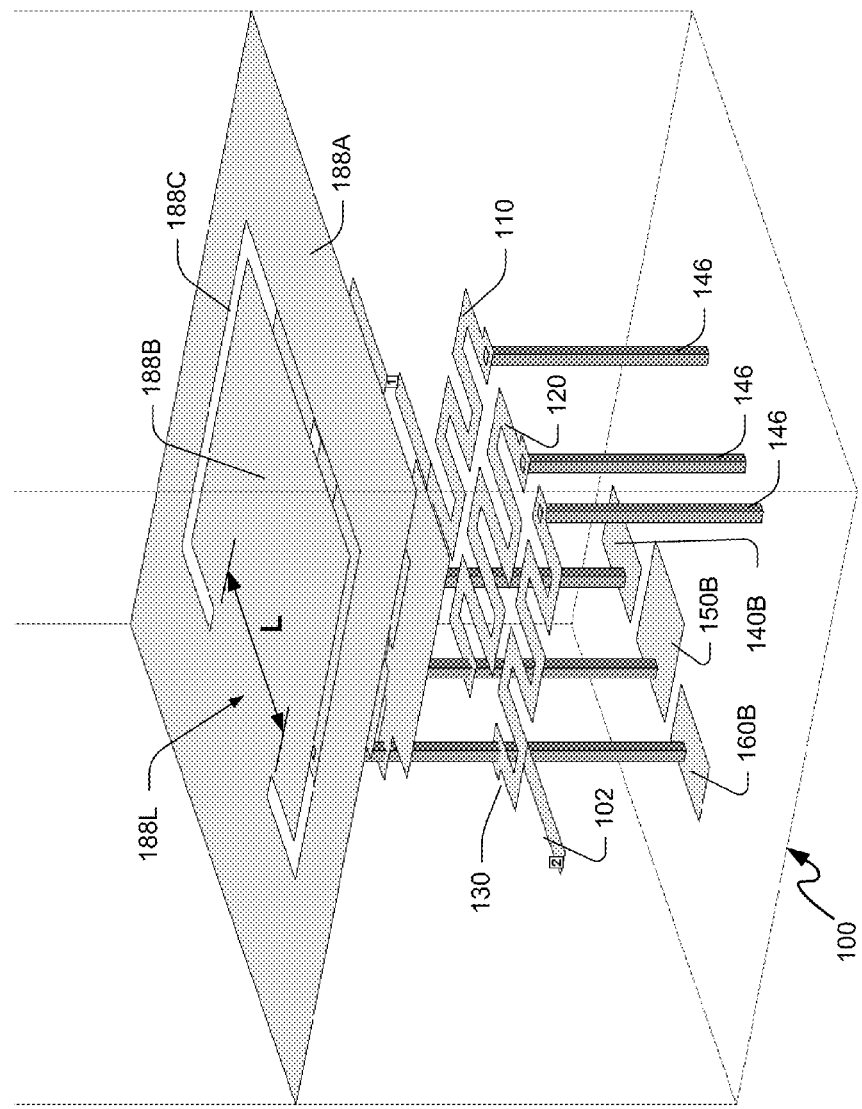
FIG. 9 illustrates an alternate perspective view of a multilayer substrate implementation of the present invention utilizing three serpentine resonators and nested coupling capacitors, with a slotted ground plane illustrated.
Figure 10:
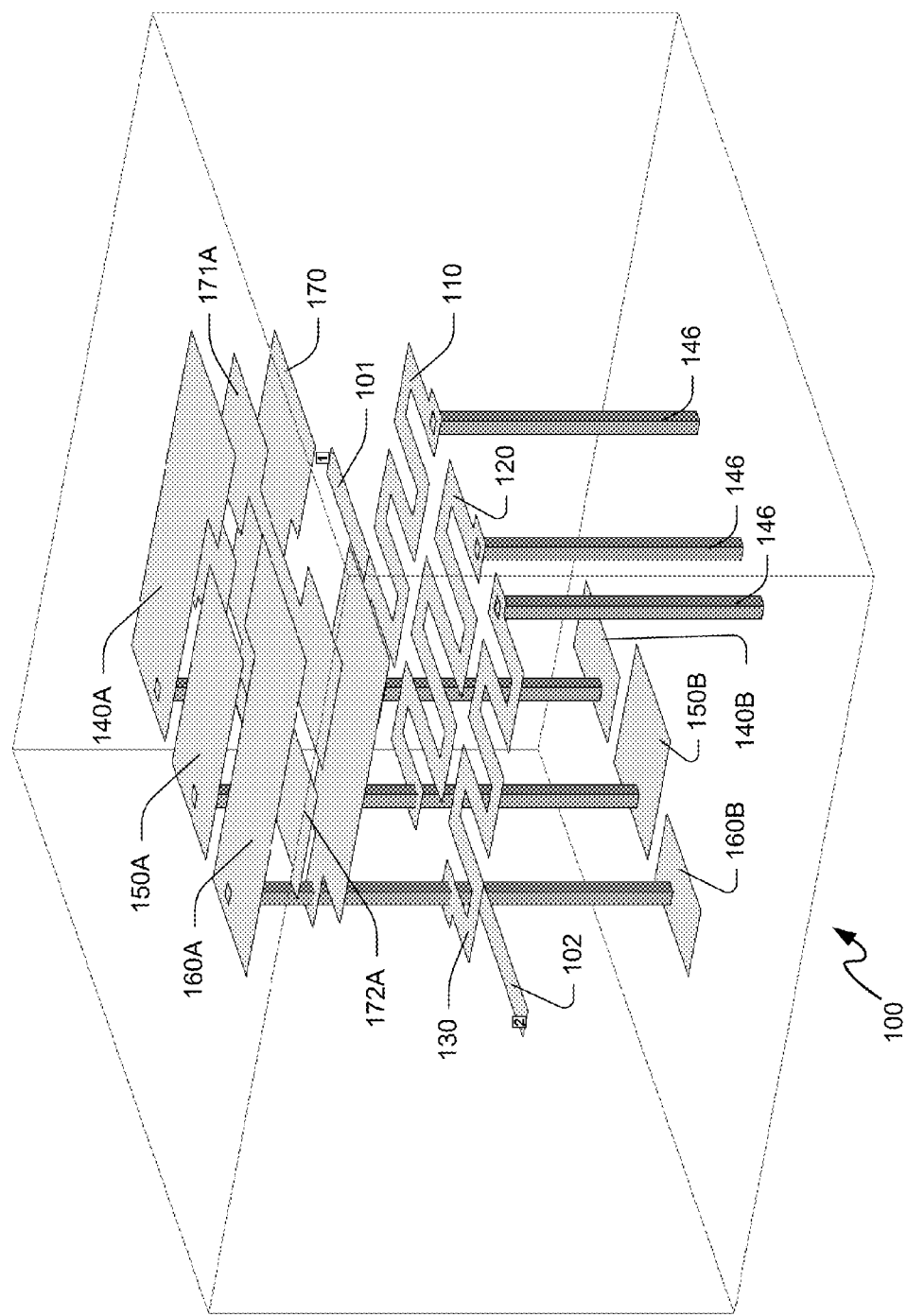
FIG. 10 illustrates a perspective view of a multilayer substrate implementation of the present invention utilizing three serpentine resonators and nested coupling capacitors with ground layer removed.
Figure 11:
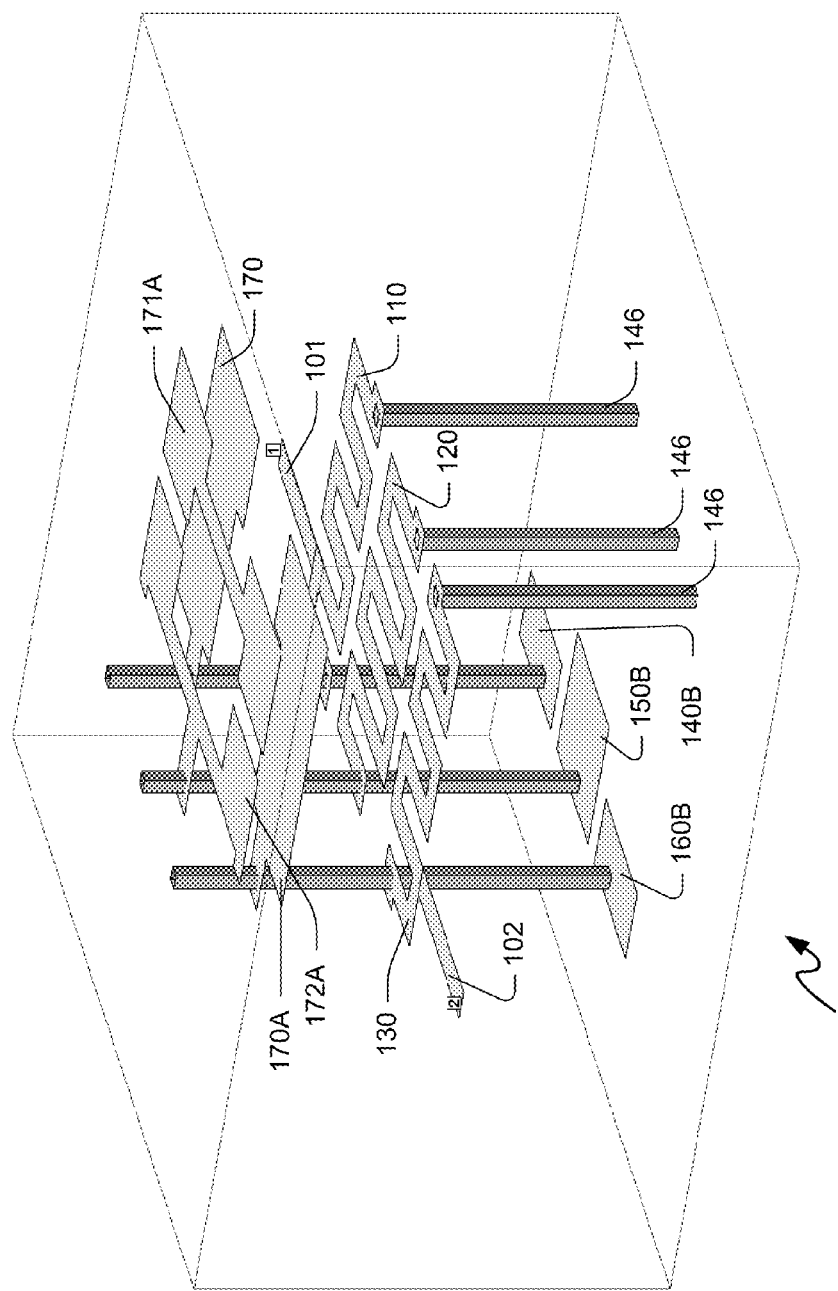
FIG. 11 illustrates a perspective view of a multilayer substrate implementation of the present invention utilizing three serpentine resonators and nested coupling capacitors with ground layer and loading capacitor plates removed.

For further illustration, the filter 100 of FIG. 8A is shown in bottom perspective view in FIG. 9. FIG. 10 provides a bottom perspective view of the filter 100 of FIG. 8A with the slotted ground plane removed for ease of illustration, showing the capacitor plates 140A, 150A, 160A of the respective loading capacitors (FIG. 8, 140, 150, 160). To further illustrate the filter 100 of FIG. 8A, FIG. 11 shows a bottom perspective view with the slotted ground plane 188A and the loading capacitor plates 140A, 150A, 160A removed, and now the capacitor plates 171A, 172A of the respective feedback and loading capacitors (FIG. 8, 171, 172) are more readily apparent. The coupling capacitors 172 and feedback capacitor 171 are formed by their proximity to capacitor plates 170, 170A. As can be seen in this embodiment, additional space and size efficiencies of the filter 100 have been achieved by also stacking the coupling and filter capacitors within the resonator footprint area.

Figure 12:
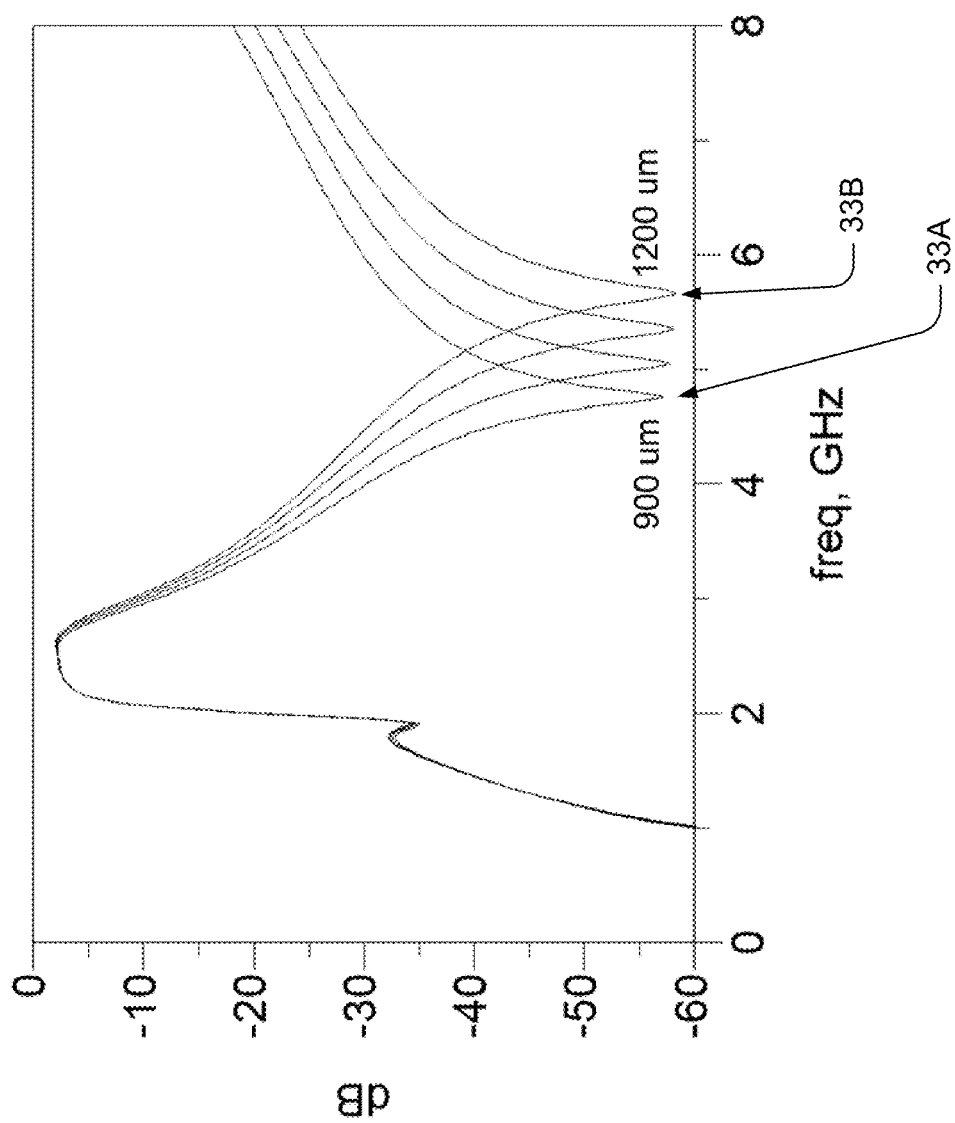
FIG. 12 illustrates an exemplary response that was obtained from a simulation of the filter of FIGS. 8A, and 9 when the dimension L of the connection area 188L was varied.

FIG. 12 illustrates an exemplary response that was obtained from a simulation of the filter of FIGS. 8A, and 9 when the dimension L of the connection area 188L was varied from 900 μm (FIG. 12, 33A, producing a transmission zero at about 4.7 GHz) to 1200 μm (FIG. 12, 33B producing a transmission zero at about 5.8 GHz). The graph shows that the frequency of the transmission zero varies approximately linearly with changes L, in this case approximately 3 MHz/μm. Therefore, by changing the dimension L of the connection area 188L, the filter skirt performance can be adjusted to desired values. Those of skill in the art realize that while the above-referenced dimensions produced the desired results, alternate substrate embodiments and design rules may produce the desired performance depending on the ultimate circuit topology and slot/void dimensions.

Figure 13:
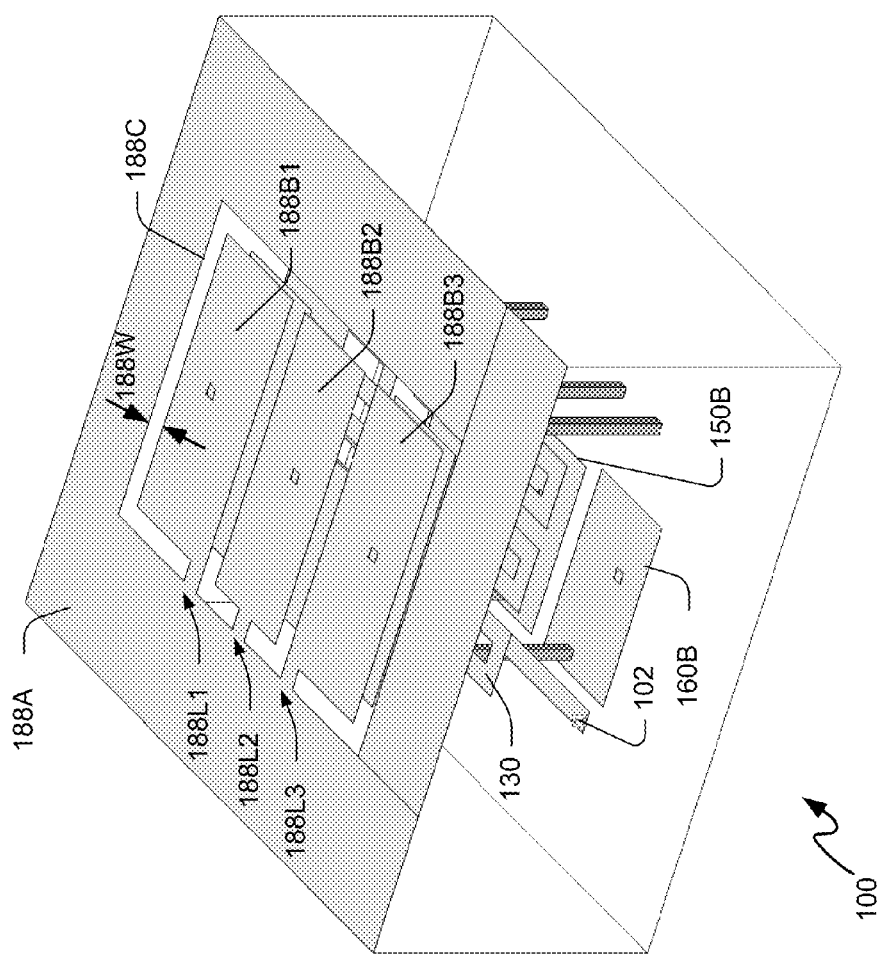
FIG. 13 illustrates a perspective view of a multilayer embodiment of the present invention with multiple partially isolated capacitive plate ground regions.

Those of skill in the art appreciate that there are multiple configurations possible for selecting voids, slots, and isolations regions in the ground plane, and each implementation may have particular suitability for different design purposes. FIG. 13 illustrates another embodiment of the present invention where multiple partially isolated regions 188B1, 188B2, and 188B3 have been formed in the ground plane 188A, and are respectively proximate to the capacitor plates 140A, 150A, 160A (not shown) forming loading capacitors coupled respectively to resonators 110, 120, 130. Each partially isolated region 188B1, 188B2, and 188B3 is connected to the ground plane by a respective connecting metal region 188C1, 188C2, 188C3. The width 188W of the slot 188C as well as the dimensions of connection regions 188C1, 188C2, 188C3 may be varied and selected to obtain any desired amount of inductance to influence filter performance, for example, in obtaining a desired transmission zero value.

Figure 14:
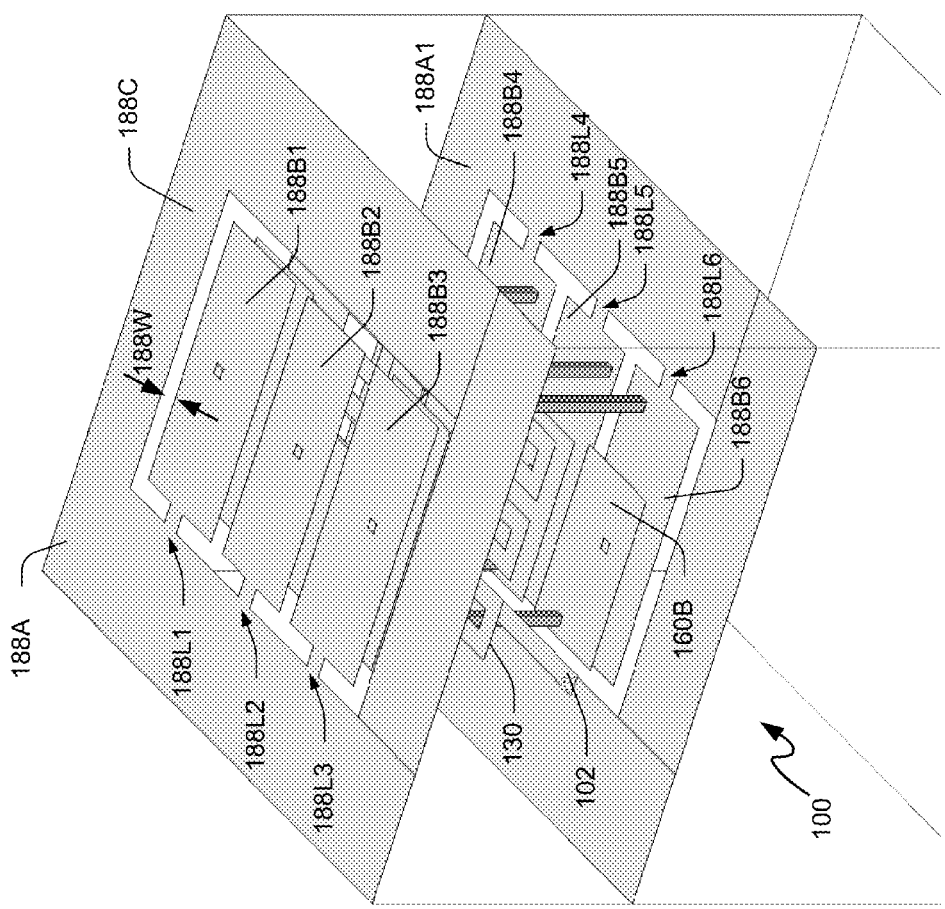
FIG. 14 illustrates a perspective view of an embodiment of the present invention with top and bottom ground planes.

FIG. 14 illustrates an embodiment with top and bottom ground planes, and similarly to FIG. 13, has multiple partially isolated regions 188B1, 188B2, and 188B3 that have been formed in the ground plane 188A, and are respectively proximate to the capacitor plates 140A, 150A, 160A (not shown) forming loading capacitors coupled respectively to resonators 110, 120, 130. Each partially isolated region 188B1, 188B2, and 188B3 is connected to the ground plane by a respective connecting metal region 188C1, 188C2, 188C3. Further, the ground plane 188A1 has multiple partially isolated regions 188B4, 188B5, and 188B6 that have been formed, and are respectively proximate to the capacitor plates 140B, 150B, 160B (not shown) forming loading capacitors coupled respectively to resonators 110, 120, 130. Each partially isolated region 188B4, 188B5, and 188B6 is connected to the ground plane by a respective connecting metal region 188C4, 188C5, 188C6. In one implementation, the connecting metal regions 188C4, 188C5, 188C6 are disposed at the opposite end of the resonators 110, 120, 130 from the connecting metal region 188C1, 188C2, 188C3, and this orientation may be desirable, for instance, in differential filter embodiments. The width 188W of the slot 188C as well as the dimensions of connection regions 188C1, 188C2, 188C3, 188C4, 188C5, and 188C6 may be varied and selected to obtain any desired amount of inductance to influence filter performance, for example, in obtaining a desired transmission zero value.

Figure 15:
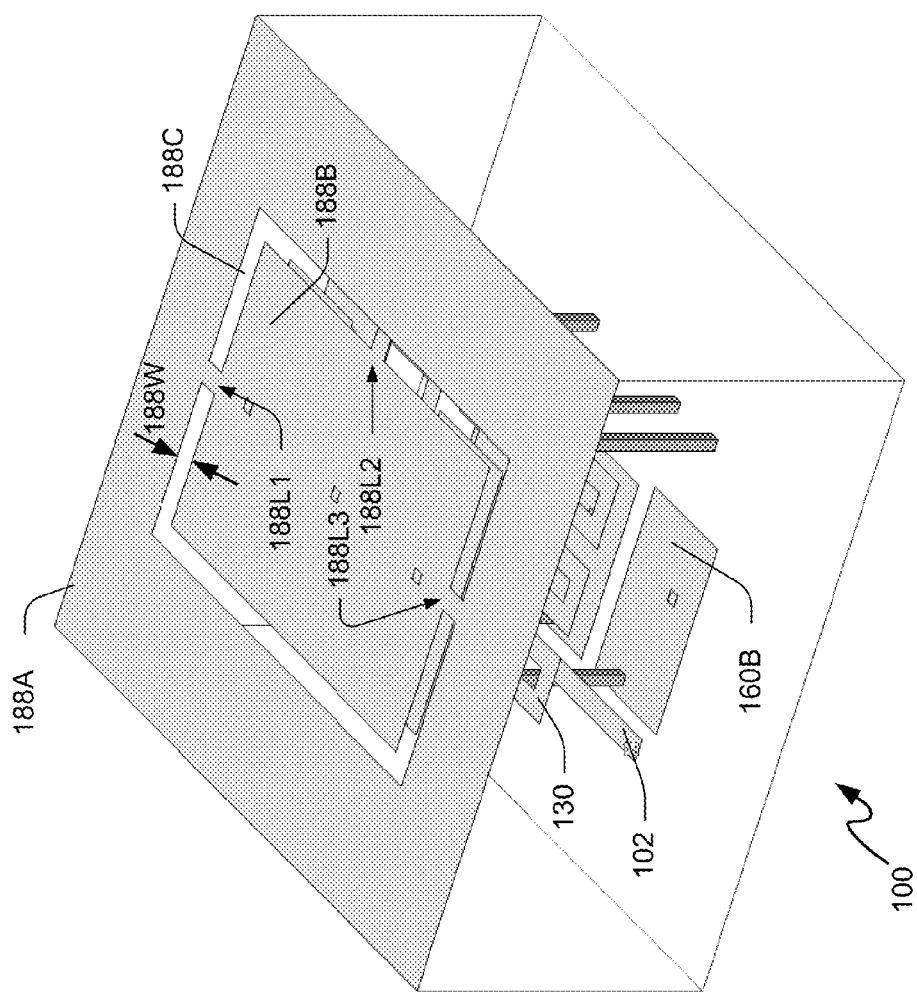
FIGS. 15-20 illustrate perspective views of alternative embodiments of the present invention with varying configurations of slotted planes and isolation regions.
Figure 16:
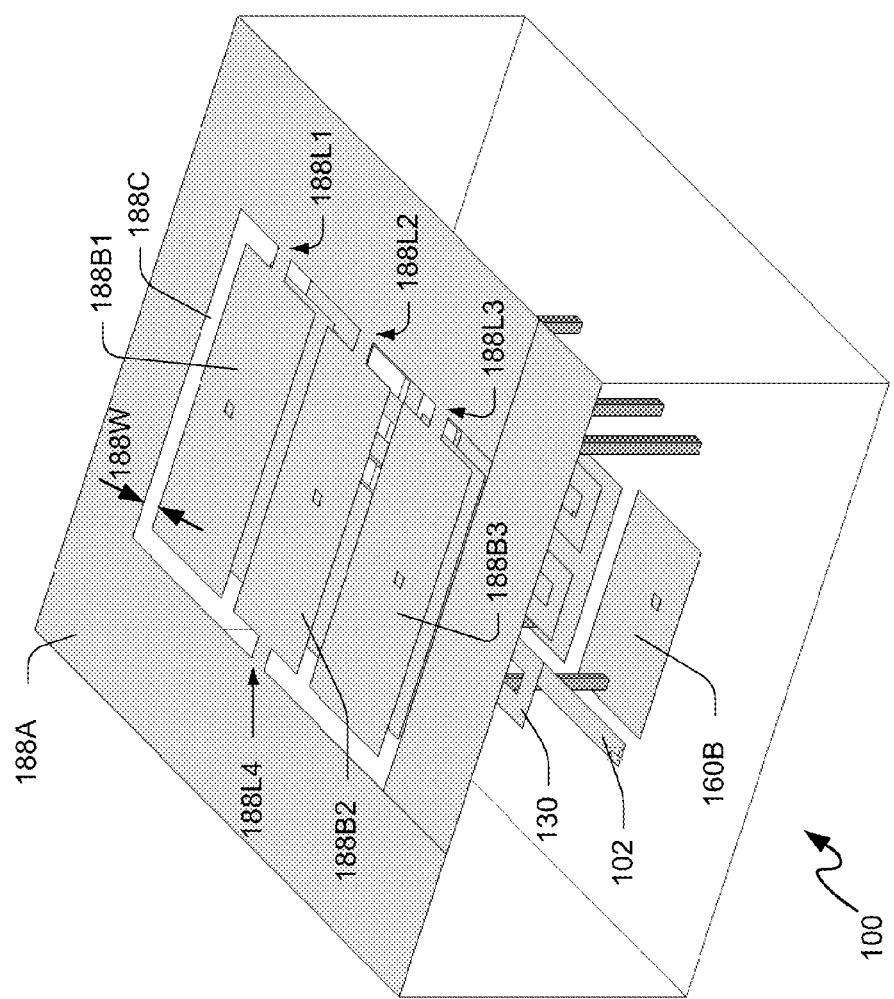
Figure 17:
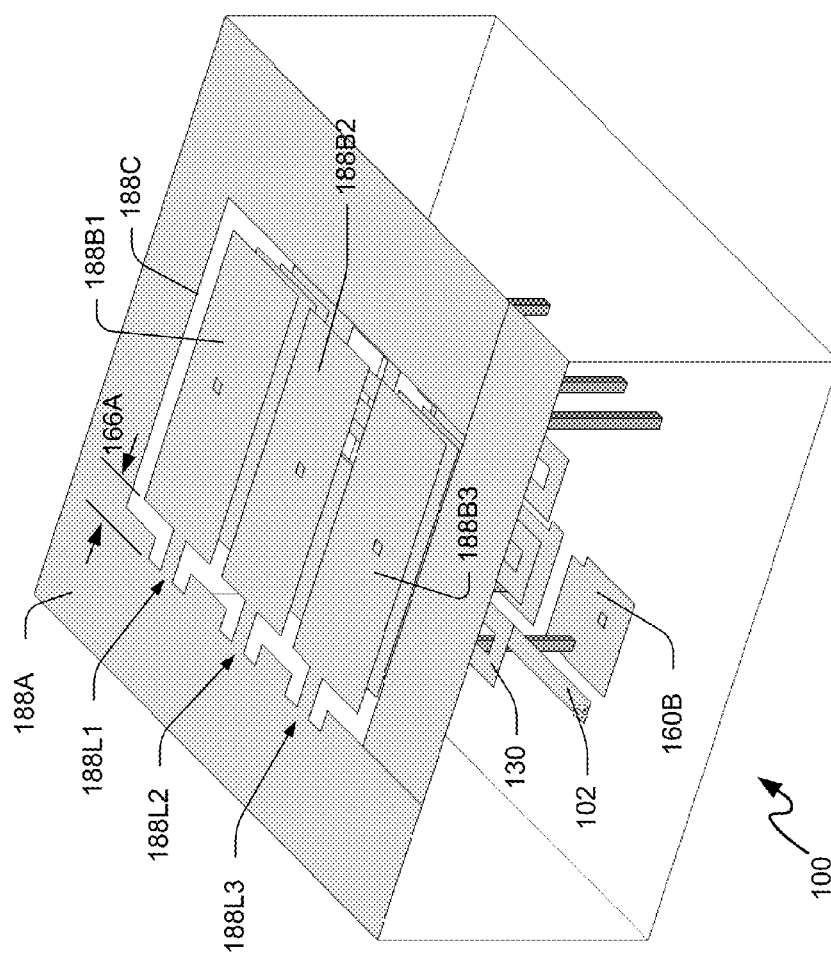
Figure 18:
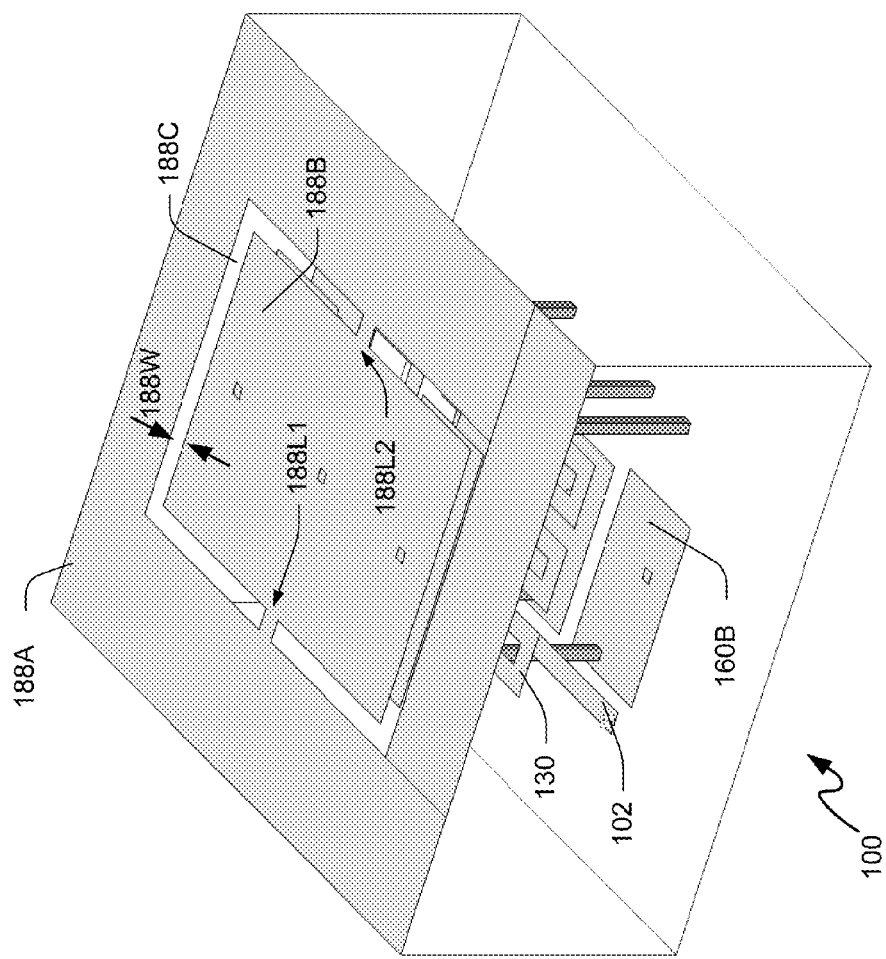
Figure 19:
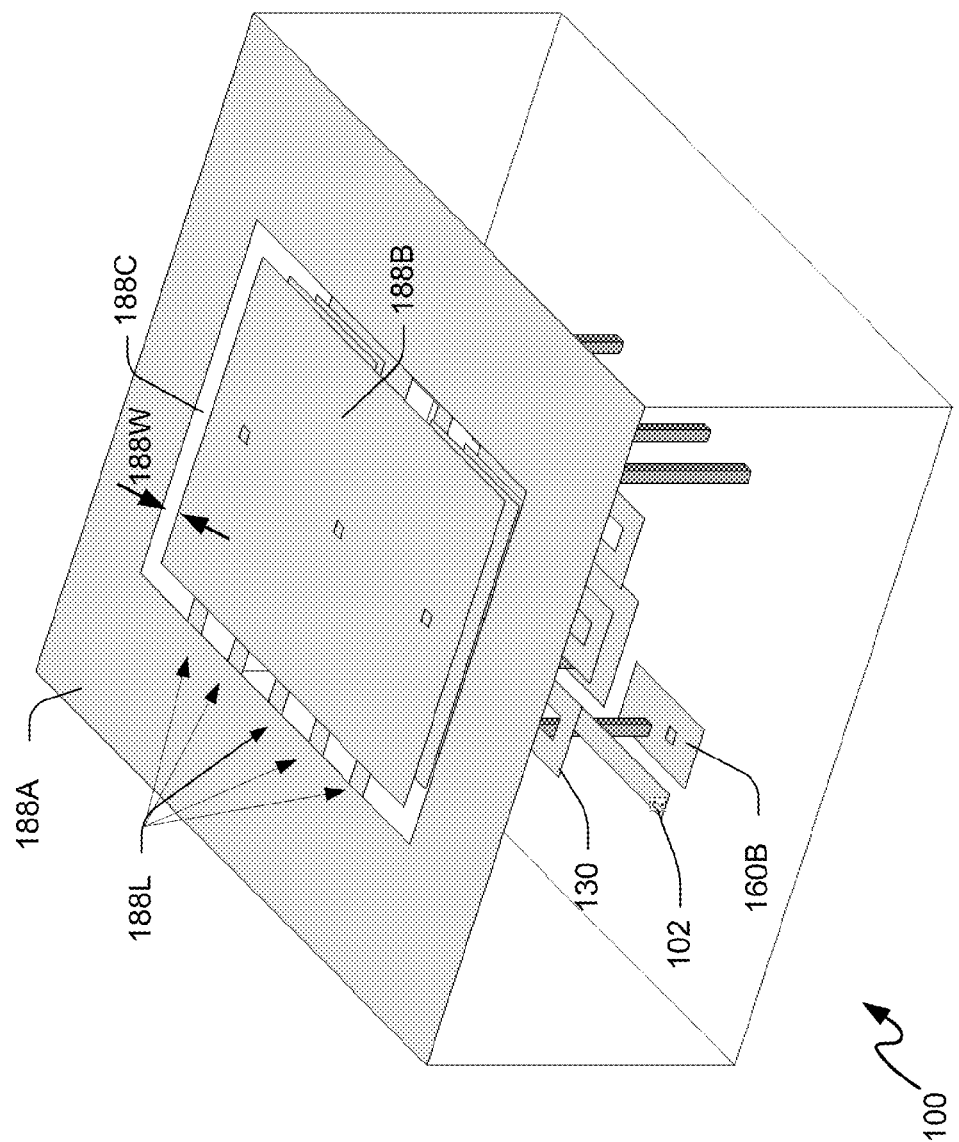
Figure 20:
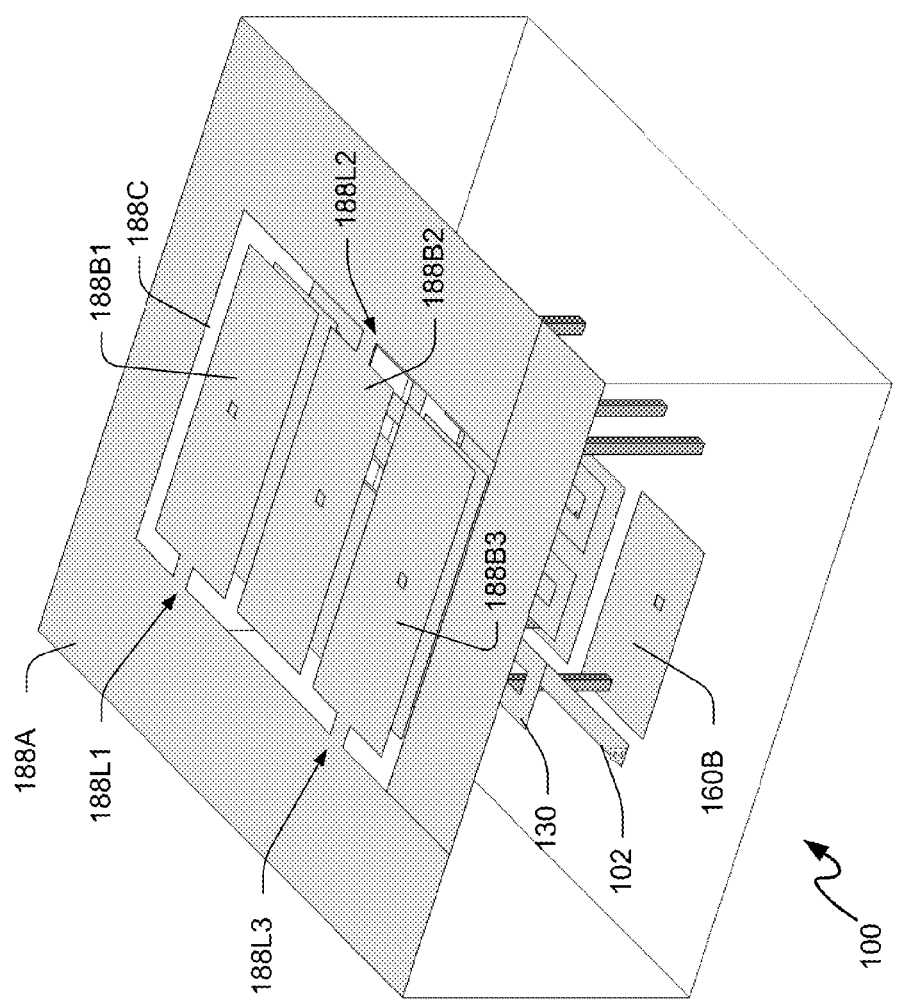

FIGS. 15-21 illustrate alternative embodiments of slotted planes and isolation region configurations to produce desired inductance values coupled with the ground plates of loading capacitors. In FIG. 15, connecting metal regions 188L1, 188L2, 188L3 are in varying sides of a single partially isolated region 188B. In FIG. 16, four connecting metal regions 188L1, 188L2, 188L3 and 188L4 connect three partially isolated regions 188B1, 188B2, and 188B3 to the plane 188A. In FIG. 17, the connecting metal regions 188L1, 188L2, 188L3 are lengthened by a predetermined amount 166A to further increase inductance. In FIG. 18, a single isolation region 188B is created in plane 188A with two opposing connecting metal regions 188L1, 188L2. In FIG. 19, a single isolation region 188B is coupled to the ground plane 188A through five connecting metal regions 188L. FIG. 20 illustrates an embodiment with four connecting metal regions 188L1, 188L2, 188L3 connecting three partially isolated regions 188B1, 188B2, and 188B3 to the plane 188A, where region 188L2 is disposed at an opposite end of the isolated regions than the other connecting regions 188L1, 188L3. Those of skill in the art appreciate that other configurations or combinations of the above illustrated embodiments may be utilized to achieve desired performance of the filter response.

Figure 21:
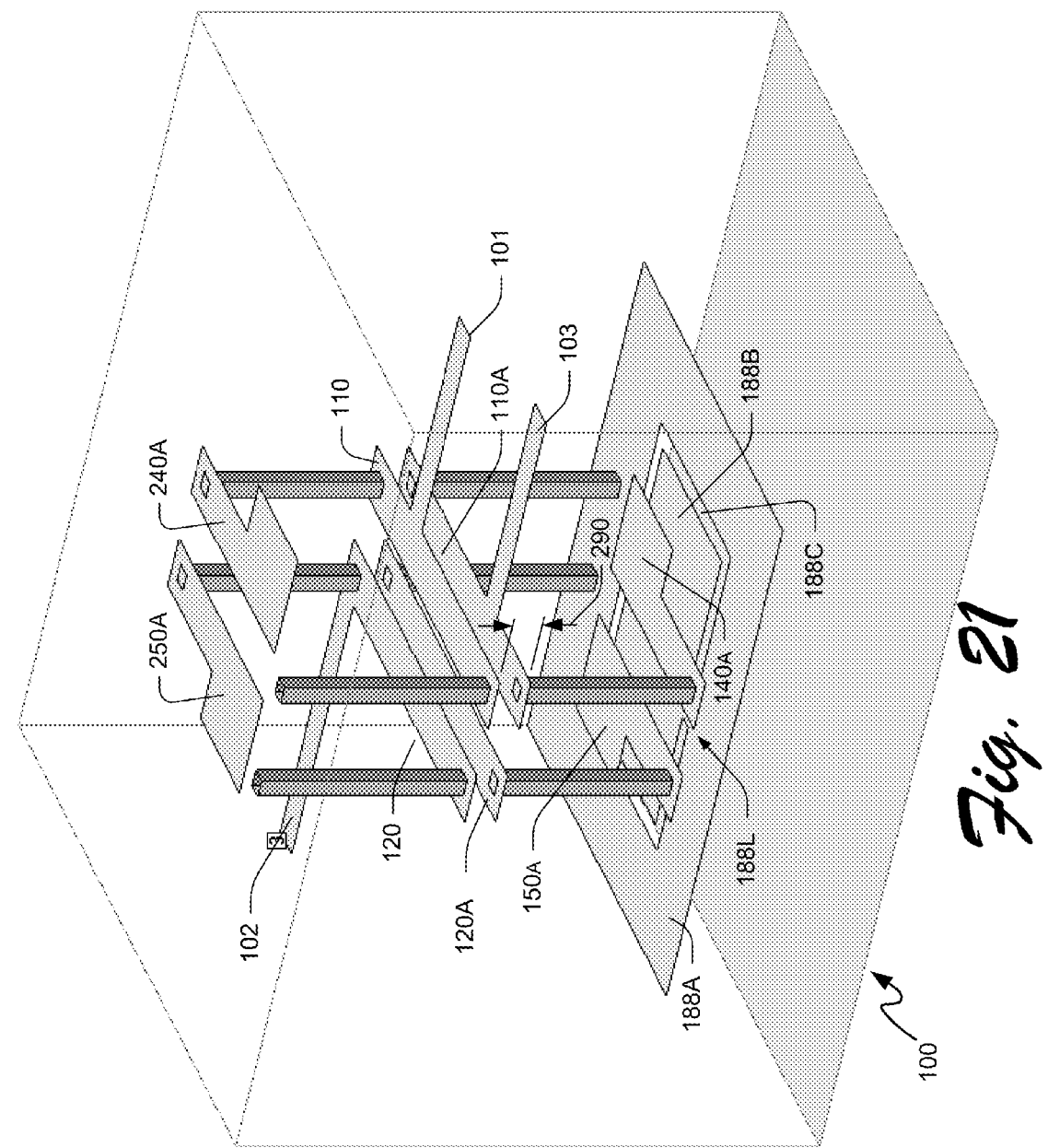
FIG. 21 illustrates a perspective view of a multilayer differential filter embodiment of the present invention.
Figure 22:
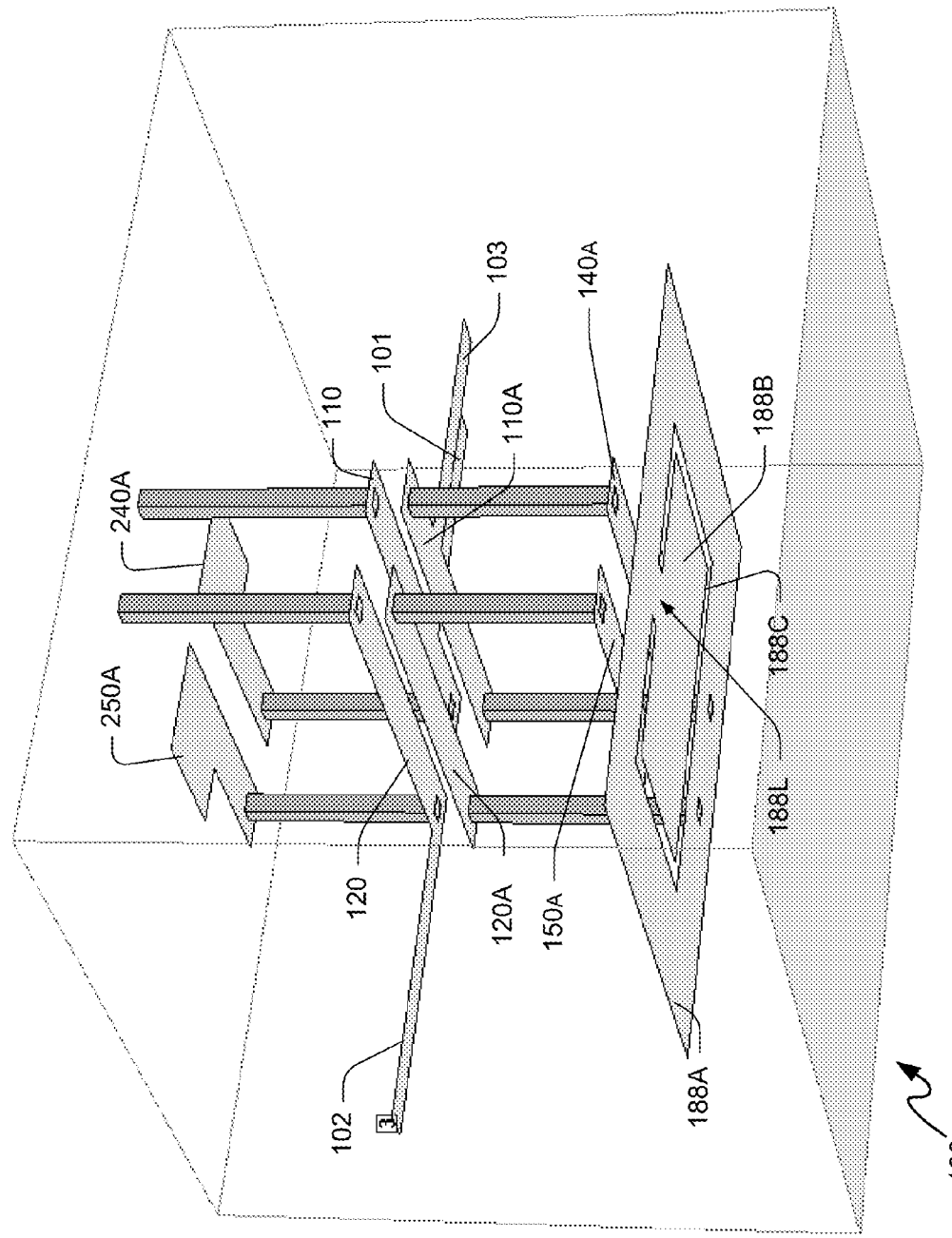
FIG. 22 shows a bottom perspective view of the multilayer differential filter embodiment of the present invention illustrated in FIG. 21.

FIG. 21 shows a perspective view of an exemplary implementation of a differential-mode configuration of resonators in a multilayer substrate. FIG. 22 also shows this implementation from a bottom perspective view for additional ease of viewing. The resonator configuration shown in FIG. 21 includes two resonator assemblies—a first assembly of (top) resonators 110, 120, and a second assembly (bottom) of resonators 110A, 120A. The assemblies are substantially similar in geometry, and in one embodiment, the assemblies are disposed as if the second resonator assembly has a similar topology but displaced vertically 290 and rotated 180 degrees about a central vertical axis (not shown). As such the resonators 110, 120, are respectively proximate to second assembly (bottom) resonators 110A, 120A, except in the apparently rotated alignment shown, the open circuit ends of the first assembly resonators are respectively proximate to the short circuit ends of the second assembly resonators, and likewise the short circuit ends of the first resonator assembly are respectively proximate to the open circuit ends of the second resonator assembly.

A first input 101 is connected to the open circuit end of resonator 110, and a second (differential) input 103 is connected to the open circuit end of resonator 110A (from the second resonator assembly). A common output 102 is connected to the open circuit end of resonator 120, and optionally, a second output could be attached to the open circuit end of the resonator 120A. As those of skill in the relevant arts appreciate, similarly to the previously illustrated embodiments, additional feedback capacitors and coupling capacitors may be similarly implemented with conductive planes in layers above and/or below the resonator layers, and alternative topologies of resonator assemblies may be utilized (e.g. three-resonator configurations). In this embodiment, the bottom ground plane 188A has a substantially isolated region 188B nearly circumscribed by slot 188C and connected to the ground plane 188A through a metal connection region 188L. A top slotted ground plane configuration (not shown) may also be utilized, and is a preferred mode in a differential embodiment, where the metal connection region of the top ground plane (not shown for clarity) is on the opposite side of the isolation region than the bottom ground plane 188A. That is, just as the top and bottom resonator assemblies are rotated 180 degrees with respect to one another, the top and bottom ground planes are similarly rotated.

Other embodiments of the invention will be apparent to those skilled in the art from consideration of the specification and embodiments disclosed herein. Thus, the specification and examples are exemplary only, with the true scope and spirit of the invention set forth in the following claims and legal equivalents thereof.

What is claimed is:

1. A filter disposed within a multilayer substrate, the filter comprising:
    a first and second resonator, the first and second resonators respectively having a short circuit end and an open circuit end, the respective short circuit ends of the first and second resonators coupled to a first ground plane;
    an input coupled to the first resonator;
    an output coupled to the second resonator;
    a first loading capacitor coupled to the open circuit end of the first resonator, the first loading capacitor comprising a first capacitor plate and a second capacitor plate;
    a second loading capacitor coupled to the open circuit end of the second resonator, the second loading capacitor comprises a first capacitor plate and a second capacitor plate; and
    wherein the first and second resonators are disposed in a resonator plane substantially parallel to and vertically displaced from at least one of the respective first capacitor plate and the second capacitor plate of the respective first and second loading capacitors, wherein at least one of the first and second resonators is at least partially overlapped by at least one of:
    the first capacitor plate or the second capacitor plate of the first loading capacitor, or the first capacitor plate or the second capacitor plate of the second loading capacitor; and wherein the first ground plane includes at least one void area wherein the void area forms a substantially isolated region of the first ground plane;

the filter further comprising an inductor coupled between at least one of the second capacitor plates of the first and second loading capacitors and the first ground plane; and wherein the value of the inductor is controlled by a predetermined dimension of a conductive coupling region disposed between at least two edges of the at least one void area of the first ground plane.

2. The filter as disclosed in claim 1, wherein the second capacitor plate of the first loading capacitor and the second capacitor plate of the second loading capacitor are substantially coplanar and are coupled to the first ground plane.

3. The filter as disclosed in claim 1, wherein the at least one void area comprises a slot of a predetermined width at least partially circumscribing a portion of the first ground plane proximal to the second capacitor plates of the first and second loading capacitors.

4. The filter as disclosed in claim 1, wherein the at least one void area comprises a plurality of slots of respective predetermined widths creating a respective plurality of at least partially isolated regions comprising the second capacitor plates of the first and second loading capacitors.

5. The filter as disclosed in claim 1, wherein the at least one void area comprises a slot of a predetermined width at least partially circumscribing a nearly complete rectangular area of the first ground plane.

6. The filter as disclosed in claim 5, wherein the nearly complete rectangular area is equal to or larger than the projected area of the first capacitor plate of the first loading capacitor and the first capacitor plate of the second loading capacitor.

7. The filter as disclosed in claim 1 further comprising a third loading capacitor coupled to the first resonator, and a fourth loading capacitor coupled to the second resonator, the third and fourth loading capacitors respectively comprising a first capacitor plate and a second capacitor plate wherein at least one of the first capacitor plates of the third and fourth loading capacitors overlap at least one of the first and second resonators.

8. The filter as disclosed in claim 7, wherein the second capacitor plate of the third loading capacitor and the second capacitor plate of the fourth loading capacitor are substantially coplanar and are coupled to a second ground plane.

9. The filter as disclosed in claim 8, wherein the second ground plane includes at least one void area wherein the void area forms a substantially isolated region of the second ground plane.

10. The filter as disclosed in claim 9, wherein the at least one void area comprises a slot of a predetermined width at least partially circumscribing a portion of the second ground plane proximal to the second capacitor plates of the third and fourth loading capacitors.

11. The filter as disclosed in claim 9, wherein the at least one void area comprises a plurality of slots of predetermined widths creating a respective plurality of at least partially isolated regions comprising the second capacitor plates of the third and fourth loading capacitors.

12. The filter as disclosed in claim 9, wherein the at least one void area comprises a slot of a predetermined width at least partially circumscribing a nearly complete rectangular area of the second ground plane.

13. The filter as disclosed in claim 9 further comprising an inductor coupled between at least one of the second capacitor plates of the third and fourth loading capacitors and the second ground plane.

14. The filter as disclosed in claim 13, wherein the value of the inductor is controlled by a predetermined dimension of a conductive coupling region disposed between at least two edges of the at least one void area of the second ground plane.

15. The filter as disclosed in claim 1, wherein the first and second resonators comprise a substantially serpentine meander shape.

16. The filter as disclosed in claim 1, wherein the substrate comprises at least one of a low temperature co-fired ceramic substrate, a high temperature co-fired ceramic substrate, a silicon substrate, a gallium arsenide substrate, a thin film substrate, and an organic circuit substrate.

17. A filter disposed within a multilayer substrate, the filter comprising:
first and second resonators, the first and second resonators respectively having a short circuit end and an open circuit end, the respective short circuit ends of the first and second resonators coupled to a first ground plane;
an input coupled to the first resonator;
an output coupled to the second resonator;
at least one loading capacitor coupled to the open circuit end of at least one of the first and second resonators, wherein:
the at least one loading capacitor includes a two or more parallel conductive elements including one or more conducting plates and one or more ground plates;
the one or more ground plates includes at least one void area in proximity to the conducting plate; and
the first and second resonators are substantially disposed in a resonator plane parallel to and vertically displaced from at least one of the conducting plate and the ground plate, wherein at least one of the conducting plate and the ground plate overlap at least one of the first and second resonators;
the filter further comprising an inductor coupled between the one or more ground plates of the at least one loading capacitor and the first ground plane; and
wherein the value of the inductor is controlled by a predetermined dimension of a conductive coupling region disposed between at least two edges of the at least one void area of the first ground plane.

18. The filter as disclosed in claim 17, wherein the one or more ground plates are substantially coplanar and are coupled to the first ground plane.

19. The filter as disclosed in claim 17, wherein the at least one void area forms a substantially isolated region of the first ground plane and further includes the one or more ground plates of the at least one loading capacitor.

20. The filter as disclosed in claim 17, wherein the at least one void area comprises a slot of a predetermined width at least partially circumscribing a portion of the first ground plane proximal to the one or more ground plates of the at least one loading capacitor.

21. The filter as disclosed in claim 17, wherein the at least one void area comprises a plurality of slots of a predetermined widths creating a respective plurality of at least partially isolated regions comprising the one or more ground plates of the at least one loading capacitors.

22. The filter as disclosed in claim 17, wherein the at least one void area comprises a slot of a predetermined width at least partially circumscribing a nearly complete rectangular area of the first ground plane.

23. The filter as disclosed in claim 22, wherein the nearly complete rectangular area is equal to or larger than the projected area of the one or more conducting plates of the at least one loading capacitor.

24. The filter as disclosed in claim 17, wherein the first and second resonators comprise a substantially serpentine meander shape.

25. The filter as disclosed in claim 17, wherein the substrate comprises at least one of a low temperature co-fired ceramic substrate, a high temperature co-fired ceramic substrate, a silicon substrate, a gallium arsenide substrate, a thin film substrate, and an organic circuit substrate.

\* \* \* \* \*